United States Patent [19]

De Subijana et al.

[11] Patent Number: 5,440,604
[45] Date of Patent: Aug. 8, 1995

[54] COUNTER MALFUNCTION DETECTION USING PRIOR, CURRENT AND PREDICTED PARITY

[75] Inventors: Joseba M. De Subijana, Minneapolis; Wayne A. Michaelson, Circle Pines, both of Minn.

[73] Assignee: Unisys Corporation, Blue Bell, Pa.

[21] Appl. No.: 233,842

[22] Filed: Apr. 26, 1994

[51] Int. Cl.⁶ .................... G06F 11/00; H03K 21/40
[52] U.S. Cl. ...................... 377/28; 377/39; 371/49.4; 371/49.1
[58] Field of Search .............. 377/28, 39, 29; 371/49.2, 49.1, 49.4

[56] References Cited

U.S. PATENT DOCUMENTS

| | | | |
|---|---|---|---|
| 3,567,916 | 3/1971 | Fullton | 377/28 |
| 3,732,407 | 5/1973 | Brewster et al. | 377/28 |
| 3,911,261 | 10/1975 | Taylor | 377/28 |
| 4,107,649 | 8/1978 | Kurihara | 371/49.14 |
| 4,606,057 | 8/1986 | van Baardewijk et al. | 377/28 |
| 5,345,489 | 9/1994 | Saitoh | 377/39 |

Primary Examiner—John S. Heyman
Attorney, Agent, or Firm—Charles A. Johnson; Mark T. Starr

[57] ABSTRACT

A counter system having associated counter error detection circuitry that utilizes the current parity, the previous parity, and a predicted parity for evaluating counter operation is described. In successive count cycles, a predicted parity is utilized, during the next subsequent count cycle is stored in flip-flop as the current parity, and in the next subsequent count cycle is stored a second flip-flop as a previous parity. Circuit are described for performing parity check and parity prediction functions. The previous parity, current parity and predicted parity will not be alike for any binary counter that operates properly. Circuity is described that holds and compares the parity of the Count, the current parity, and the previous parity, during each counter advance cycle and to provide an error signal when the counter is detected to be stuck.

11 Claims, 5 Drawing Sheets

FIG. 3

| | | PREVIOUS PARITY ~46 | CURRENT PARITY ~44 | PREDICTED PARITY ~42 |
|---|---|---|---|---|
| 0 | 0 | 0 | 1 | 0 |
| | 1 | 1 | 0 | 0 |
| | 0 | 0 | 0 | 1 |
| | 1 | 1 | 1 | 0 |
| | 0 | 0 | 0 | 1 |
| | 1 | 1 | 1 | 1 |
| | 0 | 1 | 1 | 0 |
| | 1 | 0 | 0 | 0 |
| 1 | 0 | 0 | 0 | 1 |
| | 1 | 1 | 1 | 1 |
| | 0 | 1 | 0 | 0 |
| | 1 | 0 | 1 | 1 |
| 2 | 0 | 0 | 0 | 0 |
| | 1 | 0 | 1 | 1 |
| | 0 | 0 | 1 | 0 |
| | 1 | 0 | 1 | 0 |
| | 0 | 1 | 0 | 1 |
| | 1 | 1 | 0 | 0 |
| | 0 | 1 | 0 | 1 |
| | 1 | 0 | 1 | 1 |
| 3 | 0 | 0 | 0 | 1 |
| | 1 | 0 | 0 | 0 |
| | 0 | 0 | 1 | 1 |
| | 1 | 0 | 1 | 1 |
| | 0 | 1 | 0 | 0 |
| | 1 | 1 | 0 | 0 |
| | 0 | 1 | 0 | 1 |
| | 1 | 0 | 1 | 1 |

COUNTER MALFUNCTION DETECTION USING PRIOR, CURRENT AND PREDICTED PARITY

BACKGROUND OF THE INVENTION

A. Field of the Invention

This invention relates generally to a system for detecting malfunction of a binary counter, and more particularly to an error detection system utilizing the parity of the prior count, the parity of the current count, and the predicted parity of the next sequential count to determine whether the counter has failed to change to the next numerical state upon application of the count advance signal.

B. Description of the Prior Art

Parity system are well-known in the prior art to provide a means for determining whether an operand has been calculate or transferred accurately. In binary systems, it is common to utilize circuitry that will determine whether the number of one's in the binary operand is an odd or even count. A parity bit is then associated with the operand and is set to the one or zero state depending upon whether an odd or even parity system is used, such that the number one bits in the operand together with the parity bit constitutes an odd count for odd parity, or an even count for even parity. For example, if there is a three-bit operand of the binary bits 011, and an odd parity system is utilized, it can be seen that the parity bit must be a binary one in order for the total count of binary one's in the operand plus the parity bit to be an odd count. For the same example, if the system was to be an even parity, the parity bit would be 0 since there would be two (even) binary one's in the operand.

Various prior art teachings relate to the theories and techniques of utilization of various parity systems. Many prior art teachings recognize the desirability of predicting the resultant parity bit that will be required for operands in transition during calculation processes. One such recognition of various forms of parity prediction is set forth in a treatise entitled "Fault-Tolerant Computing: Theory and Techniques", in Volume I, at section 5.2.3 commencing at page 344 and running through page 359, entitled "Parity Prediction", Dhiraj K. Pradhan, Editor, available from Prentice-Hall. While this treatise illustrates various forms of the use of parity prediction in use in various calculations and operation of adders and multipliers, it does not teach a system for use of parity bits for sequential counts to test that a binary counter accurately changes its count state for each occurrence of an count pulse.

In U.S. Pat. No. 4,291,407, entitled PARITY PREDICTION CIRCUITRY FOR A MULTIFUNCTION REGISTER, to Roffe D. Armstrong, it is recognized that it is desirable to check parity when data words are passed through registers, especially where the data words may be altered depending upon control signals applied to such registers. Armstrong describes a parity prediction circuit associated with each function of the particular register and to be utilized for predicting the parity of the data word ultimately to be stored in the register following the functional operation of the register. One of the operations involving a multifunction register it is described to be a counting function such as used in an incrementing binary counter. Armstrong describes complex circuitry involving several multiplexers and functions to respond to existing parity bits to predict future parity and determine accuracy of the function. Armstrong does not, however, teach the use of multiple sequential parity signals to assure that a counter that sticks in operation and does not advance in count with sequential advance count signals will be detected during the advance count cycle during which the counter operations sticks.

U.S. Pat. No. 3,567,916, entitled APPARATUS FOR PARITY CHECKING A BINARY REGISTER issued to James M. Fullton, Jr., et at., recognizes that in a binary counter the parity bits will change for advancing counts in a predictable fashion. Fullton, Jr., et at. describes an error checking system for use with a binary counter wherein the parity of the current count is compared to a previously stored predicted parity for determining that the circuit has properly advanced. This configuration, utilizes a set and reset tip-flop for recording the predicted parity during the previous count cycle. The Fullton, Jr., et at. system is deficient in that it appears that a stuck counter may not be detected immediately. Further, it appears that if the counter sticks at the most in opportune time it may not detect the stuck counter. In the best case, the Fullton, Jr., et at. device may allow at least two sequences of erroneous count before the predicted count will appropriately change to signal the error condition. This operation will allow the operation and the data involved to be corrupted.

From the foregoing, it can be seen that all of the prior art teachings have been limited to use of the parity bit for the operand word under consideration and a predicted parity based upon a formulation and system for predicting the parity outcome. None of them recognize that when applied to sequential counts, that the two parity bits are insufficient to immediately detect a stuck counter. The occurrence of multiple cycles of a stuck counter can cause serious problems of corrupted operation or corrupted data.

OBJECTS

It is a primary object of this invention to provide an improved parity system for detecting errors in count for a binary counter.

Yet another object of this invention is provide an improved error detection system for use in evaluating proper performance of a binary counter that detects counter error in the advance cycle that the error occurs.

Still another object of this invention is to provide an improved parity system for use with a binary counter that employs a system of utilizing the previous parity of the previous count, the current parity of the current count, and the predicted parity of the next count, to immediately detect when the counter sticks or malfunctions.

A further object of this invention is to provide an improved error detection system for use with a binary counter utilizing a recorded prior parity, a recorded predicted parity from the previous count, and the current parity to effect detection of counter malfunction.

Still another object of this invention is to provide an improved parity prediction system for use with a binary counter that is capable of detecting counter malfunction during the count cycle that is easy and economical to construct.

Other more detailed objectives will become apparent from a consideration from the Drawings taken in conjunction with the Detailed Description of the Preferred Embodiment.

SUMMARY OF THE INVENTION

This invention provides a counter error detection system operable with a binary counter that determines when the counter fails to properly count when a count advance signal is applied. In order to detect a stuck or failed counter during the same cycle during which the advance signal is applied, the counter error detection system utilizes the current parity of the count, the predicted parity for the next count, and the previous parity for the preceding count. By analyzing these three parity signals, the counter error detection system can determine malfunction of the counter. In a properly operating counter, these three parity signals should never be identical, and if identity occurs, the counter is malfunctioning.

The counter error detection system includes parity checking circuitry arranged to provide a first parity error signal when the binary counter signals do not satisfy a predetermined parity system. A parity prediction circuit is coupled to receive the binary count and is arranged to provide a predicted parity signal indicative of the parity for the next sequential count of the binary counter. A first bistable device is utilized with the parity prediction circuit for temporarily storing the predicted parity signal where it is identified as the current parity signal during the occurrence of the next applicable count advance signal. A second bistable device is utilized in conjunction with the first bistable device and is arranged for temporarily storing the current parity signal as the previous parity signal during the occurrence of the second next count advance signal. A pair of multiplexers are utilized selectively to initialize the first and second bistable devices, and after initialization, are used to select the sequential setting of the first and second bistable devices during sequential count advance signals. A comparator circuit is coupled to the parity checking circuit, the parity prediction circuit, and the first and second bistable devices, and is operable for each count advance signal to provide a second parity error signal if and when the predicted parity signal, the current parity signal, and the previous parity signal for the particular binary count are equal.

BRIEF DESCRIPTION OF THE DRAWINGS

In this Application:

FIG. 3 is a chart for a 4-bit binary counter illustrating the relationship of the previous parity, the current parity, and the predicted parity to each of the binary counts;

DETAILED DESCRIPTION OF THE PREFERRED EMBODIMENT

Figure 1:
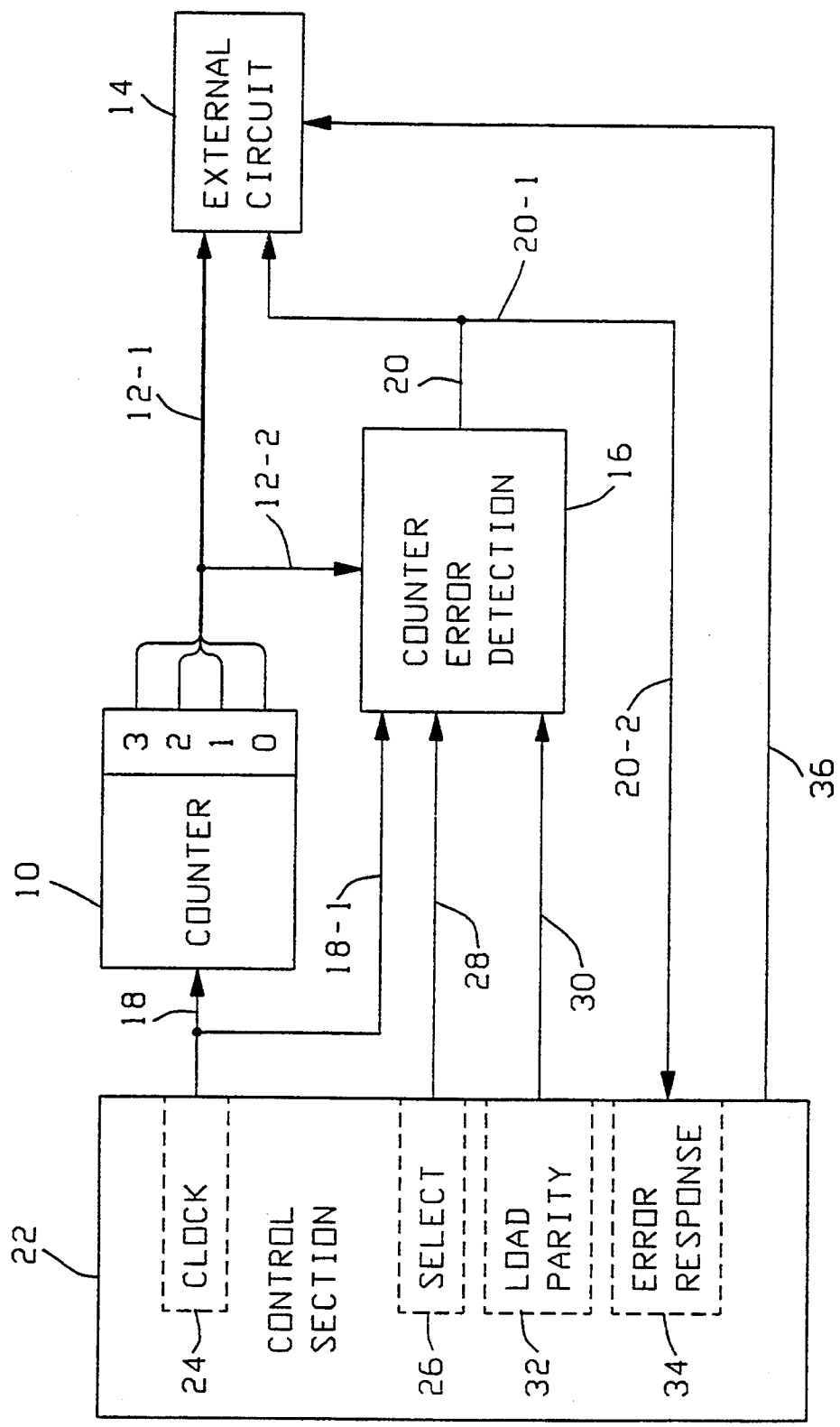
FIG. 1 is a simplified block diagram of an electronic system utilizing a binary counter with the parity error detection system of the present invention.

FIG. 1 is a simplified block diagram of an electronic system utilizing a binary counter with the parity error detection system of the present invention. In this configuration a binary Counter 10 is arranged to provide a 4-bit count on cable 12-1 to External Circuit 14, and on cable 12-2 to Counter Error Detection Circuit 16. Counter 10 can be any implementation of a Counter that modifies its binary count for each application of signal received on line 18. As shown in this configuration the 4-bit Counter has stages 0, 1, 2, and 3 representing the binary bit positions in increasing order of significance. The counter could be a circuit functioning as a program address counter where the External Circuit 14 would be logic arrangement for accessing and executing instructions in an addressed order based upon Counter 10. Alternatively, Counter 10 could be a counter that operates to control a predetermined number of iterations of some function being performed by External Circuit 14. In any case, malfunction or sticking of Counter 10 such that is fails to provide sequential counts could result in erroneous reference to instructions to be performed or result in other malfunction of the External Circuit 14 such that functional operation or data is corrupted. Various types of External Circuits 14 man be utilized with the invention, and will be readily apparent to those skilled in the art. These functions will not be described in detail further.

The Counter Error Detection 16 circuitry operates to utilize the parity of the preceding count, the current parity, and the predicted parity to analyze the selected sequence of parity transformations to detect when Counter 10 malfunctions. A detected error results in a signal on line 20 that is fed on line 20-1 to the External Circuit 14 where it can be processed by circuitry (not shown) to respond to the error condition. The Control Section 22 functions to initialize and control the functionality of the Counter 10 and the Counter Error Detection circuitry 16. In the preferred embodiment the Counter 10 is caused to be advanced upon each occurrence of the Clock 24. The Clock is a regularly occurring shaped signal as will be described in more detail below, and is applied to sequence the operation of Counter 10 and is applied on line 18-1 to control the functionality of the circuitry in the Counter Error Detection 16. At initialization, the Select circuitry 26 will provide a signal on line 28 to cause selection of the parity provided on line 30 by Load Parity 32. After the initialization and the initial cycle, a second signal will be provided on line 28 from the Select circuitry 26 such that the sequence of parity bit evaluation exercised by the Counter Error Detection circuitry 16 will relate to the previous parity, the current parity, and the predicted parity for the count emanated from Counter 10.

If an error is detected and an error signal put out on line 20, the error signal will be directed on line 20-2 to the Error Response circuitry 34 in Control Section 22 where appropriate response will be taken to the error condition. The Control Section 22 is coupled via line 36 to the External Circuit 14 over which appropriate control signals can be passed to provide the appropriate response by the External Circuit to the detected malfunction of Counter 10. These functions will not be described in detail, but could simply be to disable further operation of the External Circuit, or it could cause the External Circuit to execute corrective and disengaging functions, or whatever response would be appropriate for the particular system. These functions will not be described in the further detailed and will be obvious to those skilled in the art. As will be described in more detail below, the parity for the next count from Counter 10 is predicted on the basis of what the next count will be.

Figure 2:
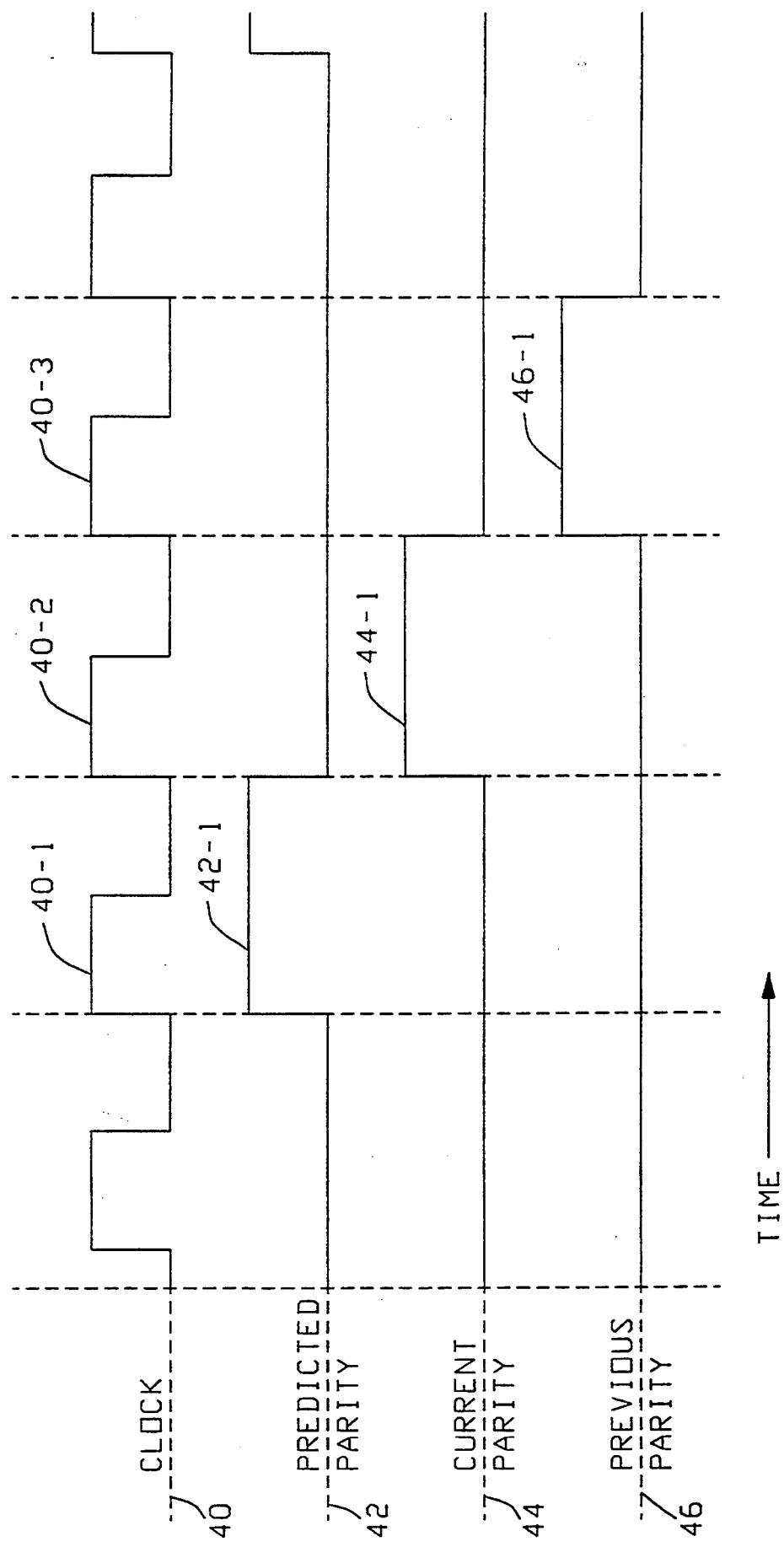
FIG. 2 is a timing diagram illustrating the relationship of a predicted parity, a current parity, and a previous parity to the system dock signals.

FIG. 2 is a timing diagram illustrating the relationship of a predicted parity, a current parity, and a previous parity to the system clock signals. For this configuration, the Clock signal 40 is a regularly occurring shaped sequence of signals that when applied on line 18 to Counter 10 causes the Counter to count for each Clock cycle. The Predicted Parity signals 42 are determined on Clock sequence 40-1 where the Predicted Parity is established at signal 42-1. The Current Parity 44 is evaluated during Clock signal cycle 40-2 and is established by signal 44-1. Finally, the Previous Parity 46 is established at Clock Signal 40-3, as shown at signal 46-1. As will be deserted in more detail below, this illustrates the sequenced moving of the Predicted Parity to the Current Parity and to the Previous Parity through sequential Clock cycles.

FIG. 3 is a chart for a 4-bit binary counter illustrating the relationship of a predicted parity, a current parity, and a previous parity to the system clock signals. For this configuration an odd parity system is described. By way of example, for the binary count 0010, labeled 48, the Current Parity 44 will be 0 thereby satisfying the odd count of one's. Also by way of example for the binary example 0110, labeled 50, the Current Parity in column 44 is a 1 such that the total count of one's is odd.

The Predicted Parity representations in column to 42 indicate the parity bits that will occur for the next count of the Counter and the Previous Parity in Column 46 illustrates for each count value the parity from the previous count.

For the binary Counter 10, it will be noted that none of the sequences of parity bits for the Predicted Parity 42, the Current Parity 44, and the Previous Parity 46 ever extends for a sequence of three or more counts with the parity bits of the same state. It can also be seen that as the count progresses in Counter 10, that for any given count, the Predicted Parity, the Current Parity and the Previous Parity are identical signals. For example, if binary count 0011, labeled 52, is considered, the Current Parity is 1, the Predicted Parity 42 established on the previous cycle is 1, and the Previous Parity 46 is 1, all as shown within dashed enclosure 54. If the binary number 1000, labeled 56, is considered, it can be seen at the Current Parity 44 is 0, the Predicted Parity 42 is 0 and the Previous Parity 46 is 0, all as shown within dashed enclosure 58. This illustrates how the Predicted Parity moves through the stages for subsequent counts. FIG. 3 also illustrates that for evaluation of each count the Predicted Parity, the Current Parity and the Previous Parity are never all of the same states. These relationships will be utilized in the specific implementation to evaluate each count emanating from Counter 10 to determine within one Clock cycle that it is operating properly.

Figure 4:
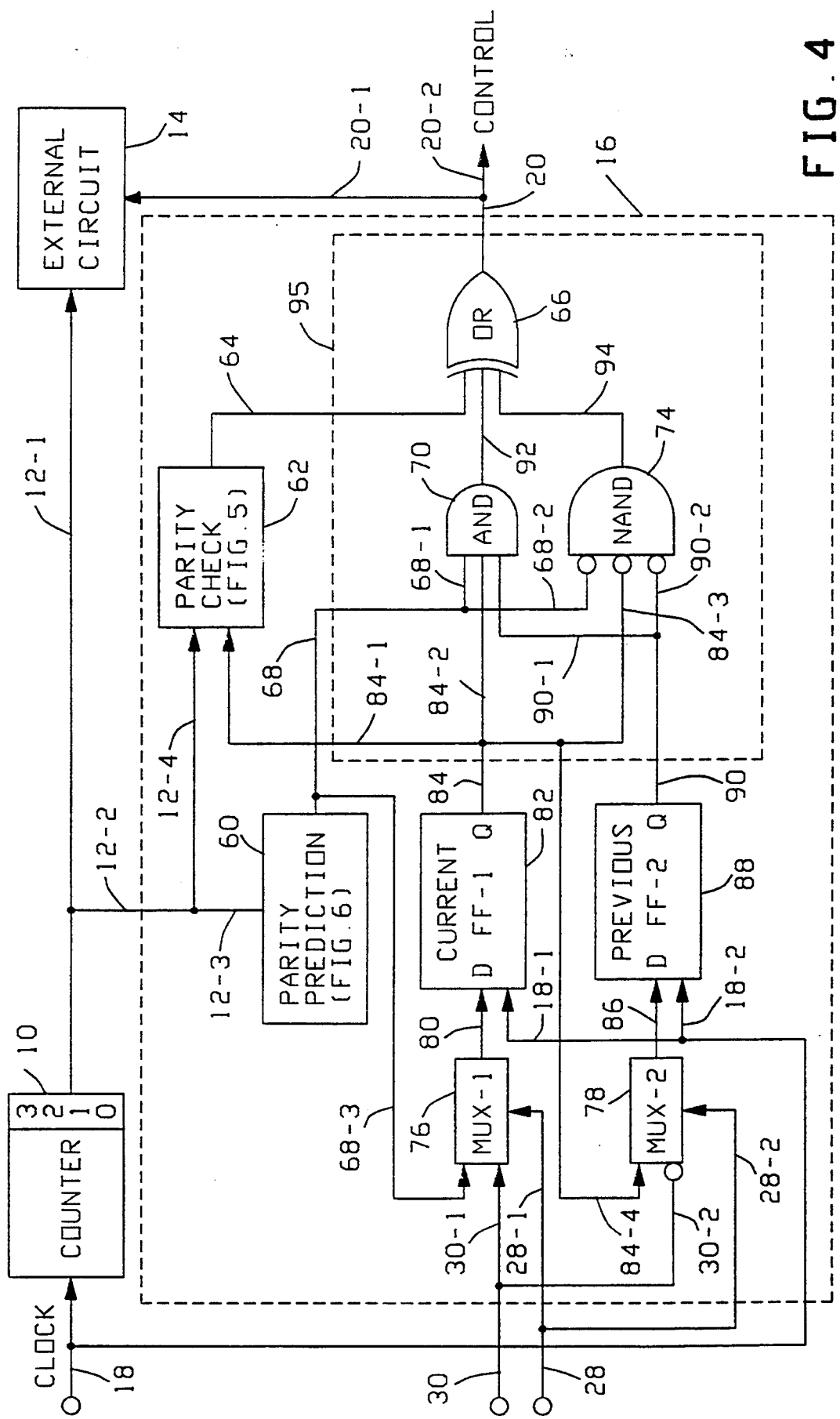
FIG. 4 is a more detailed block diagram of the counter error detection system.

FIG. 4 is a more detailed block diagram of the counter error detection system. The Counter Error Detection circuitry 16 is shown within dashed block 16. The Counter 10 receives the Clock signal on line 18 and the count is provided on cable 12-1 to External Circuit 14 as previously described. The count is also passed on cable 12-2 into the Counter Error Detection circuitry 16 where it is directed on cable 12-3 to Parity Prediction circuitry 60 and on cable 12-4 to Parity Check circuitry 62. The Parity Check circuitry will be described in more detail with respect to FIG. 5, and operates on the existing count to provide a parity status signal on line 64 to OR 66. For reasons that will be described below, the actual determined Parity is inverted as it comes out the Parity Check circuitry 62.

The Parity Prediction circuitry 60 will be described in more detail below with regard to FIG. 6, but functionally will be understood to operate on the current count value to determine the Predicted Parity that should occur for the next count. For reasons that will be later described, the Parity Prediction circuitry 60 provides the inverted value of the Predicted Parity on line 68 where it is directed on line 68-1 as one of the input signals to AND circuit 70 and on line 68-2 as one of the input signals to NAND circuit 74.

The Counter Error Detection Circuitry 16 utilizes two multiplexers MUX-1, labeled 76, and MUX-2, labeled 78, that are basically used to serve as selectors. The Select signal is applied on line 28-1 to MUX-1 and on line 28-2 to control MUX-2. As previously described, during the initial operation, the signals on line 28 cause MUX-1 and MUX-2 to select and pass the initializing parity signals received on line 30-1 and inverted on line 30-2, respectively, When the system is fully operational, the Select signals received on line 28 will be altered such that MUX-1 will respond to pass the Predicted Parity signal received on line 684 to its output line 80 to cause the D-type flip-flop FF-1, label 82, to be set. It can be seen that as the Clock signal applied on line 18-1 to FF-1 allows it to be set, the Predicted Parity in the previous cycle will be set as the Current Parity. This Current Parity Signal is provided on line 84 and is directed on line 84-1 to the Parity Check circuitry 62, on line 84-2 as an input to AND 70, and on line 84-3 as an input to NAND 74. This Current Parity signal is applied on line 844 as an input to MUX-2. When the Select signal on line 28 is operational to select the internally determined parity signals, MUX-2 provides the Current Parity signal on line 86 during the next successive Clock cycle to cause it to be stored in flip-flop FF-2, labeled 88, as the Previous Parity signal. The Previous Parity signal is provided on line 90 and is directed to AND 70 on line 90-1 and to NAND 74 on line 90-2. AND 70 provides its output on line 92 to OR 66 and NAND 74 provides its output on line 94 to OR 66. The combination of input signals at OR 66 is such that all signals must be equal and of 0 state. The combination of operation of AND 70, NAND 74, and OR 66 is basically a comparator operation, and the Comparator is shown within dashed block 95. See the combinations of Predicted Parity 42, Current Parity 44, and Previous Parity 46 illustrated in FIG. 3. If any input into OR 66 is a 1, it indicates that the Counter has stuck, and a counter error signal will be issued on line 20-1 to the External Circuit 14 and on line 20-2 to the Control Section.

The cycling of the Predicted Parity signal 42, the Current Parity 44, and Previous Parity signal 46, as described in FIG. 2 illustrates that for three consecutive clock cycles and three consecutive counts these signals will be identical, either all one's shown as example 54 in FIG. 3 or all zero's shown as example 58 in FIG. 3.

In operation, AND 70 functions such that any input signals received on lines 68-1, 84-2, 90-1 must be 0 in order for a 0 to be provided on line 92. If all input signals to AND 70 are 1, an error has been detected and 1 will be provided on line 92 to OR 66 which will re, suit in an error signal on line 20. NAND 74 also operates to check that its three input signals received on line 68-2, 84-3, and 90-2 are in the same state. This circuit functions such that any input signals must be binary 1 in order to provide a 0 output on 94. If all of the input signals are 0, NAND 74 will provide a binary 1 on line 94 as an input to OR 66, and again will indicate a parity error condition on line 20.

Figure 5:
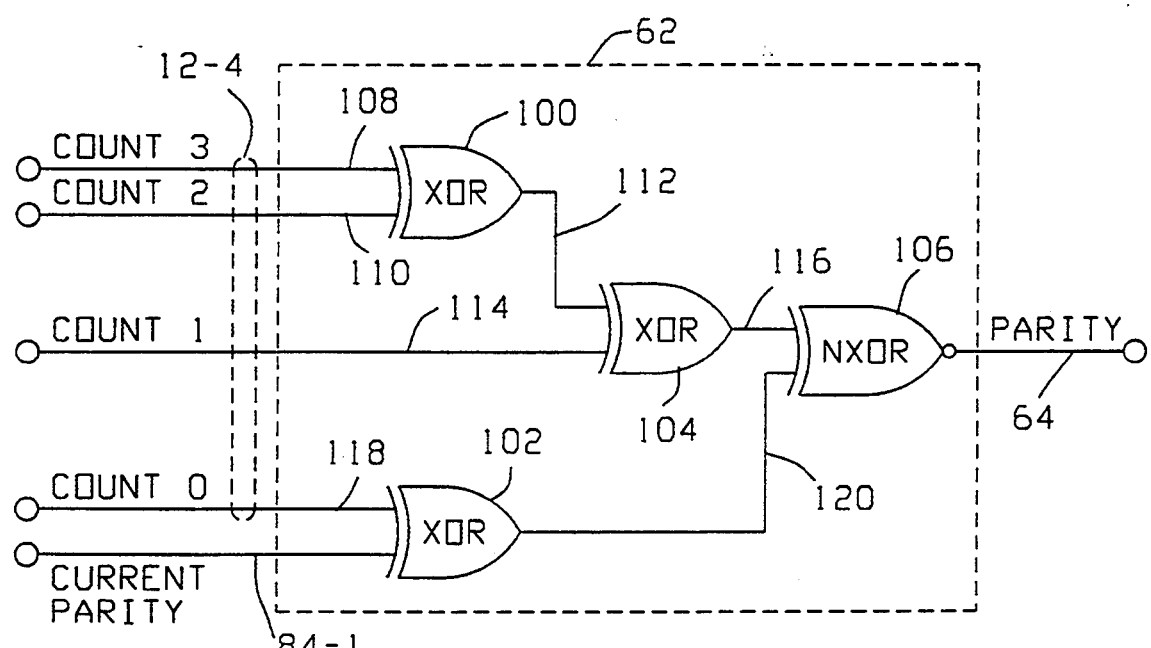
FIG. 5 is a logic diagram illustrating generation of the current parity signal.

FIG. 5 is a logic diagram illustrating generation of the current parity signal. The Parity Check circuitry is shown enclosed within dash block 62 and has the Count 0, the Count 1, the Count 2, and the Count 3 signals applied on cable 124 as shown by the dashed enclosure. The Current Parity is received on line 84-1. The Parity Cheek Circuitry is comprised of X OR 100, X OR 102, X OR 104, and NX OR 106. Count 3 is applied on line 108 to X OR 100 and Count 2 is provided on line 110 to X OR 100. The output of X OR 100 is provided on line 112 as one input to XR 104. Count 1 is provided on line 114 as the other input to X OR 104 which provides its output signal on line 116 to NX OR 106. Count 0 is applied on line 118 to XR OR 102 in combination with the Current Parity provided on line 84-1 and the output of X OR 102 is provided on line 120 as the other input to NX OR 106.

As is well-known a two-input X OR circuits function such that its output signal will be a binary 1 only if one or the other, but not both, of its input signals is one. The NX OR circuit includes an inversion at its output and functions such that it will provide a 0 output signal only if one or the other, but not both, of its input signals are binary 1. These circuit functions are well-known and need not be described further since they are clear to those skilled in the art.

By way of specific example of its operation, if it is assumed that the binary count 1011, as shown by example 122 in FIG. 3, is applied to the Parity Cheek Circuitry 62, it can be seen that the Current Parity input signal on line 84-1 will be a binary 0 as determined from the status of the state of FF-1 labeled 82. The Count 0 will be 1 yielding a 1 signal from X OR 102 on line 120 to NX OR 106. Count 1 will be a binary 1 on line 114 to XR 104. Count 2 will be a binary 0 on line 110 to X OR 100 and Count 3 will be a 1 on line 108. The binary 1 on line 108 and binary 0 on line 110 will result in X OR 100 providing a binary 1 on line 112 to X OR 104. With both input signals binary 1, X OR 104 will provide a 0 on line 116 to NX OR 106. Since only one input to NX OR 106 is a 1, it will provide a binary 0 output on 64 indicating that the parity for the count as read is correct. The various other combinations of counts and parity determinations illustrated in FIG. 3 can be similarly applied to this logic to illustrate that the Parity Signal on line 64 will indeed correct if the input signals are correct.

To illustrate that the Parity Cheek Circuit 62 will determine an error if the count does not follow the prescribed sequence, assume that the count fails to advance from the previous count such that Count 0 is read as a 0 rather than a 1. With the Current Parity signal on line 84-1 a 0 and the erroneous Count 0 on line 118 is a 0, X OR 102 will provide a 0 signal on line 120 to NX OR 106. The other Counts previously described for example 122 will remain as just described, with X OR 104 providing a 0 on line 116 to NX OR 106. Since NX OR 106 is provided with two 0 input signals, it will provide a binary one output signal on line 64 indicating a parity error immediately during the Clock cycle for checking parity of the current count. Other examples of parity errors or inaccurate permutations of count will illustrate the similar generation of parity errors.

For this particular circuit configuration, as is true for most prior art parity checking circuitry, the advent of two count digits in error will be cancelling, and will not be caught as a parity error.

Figure 6:
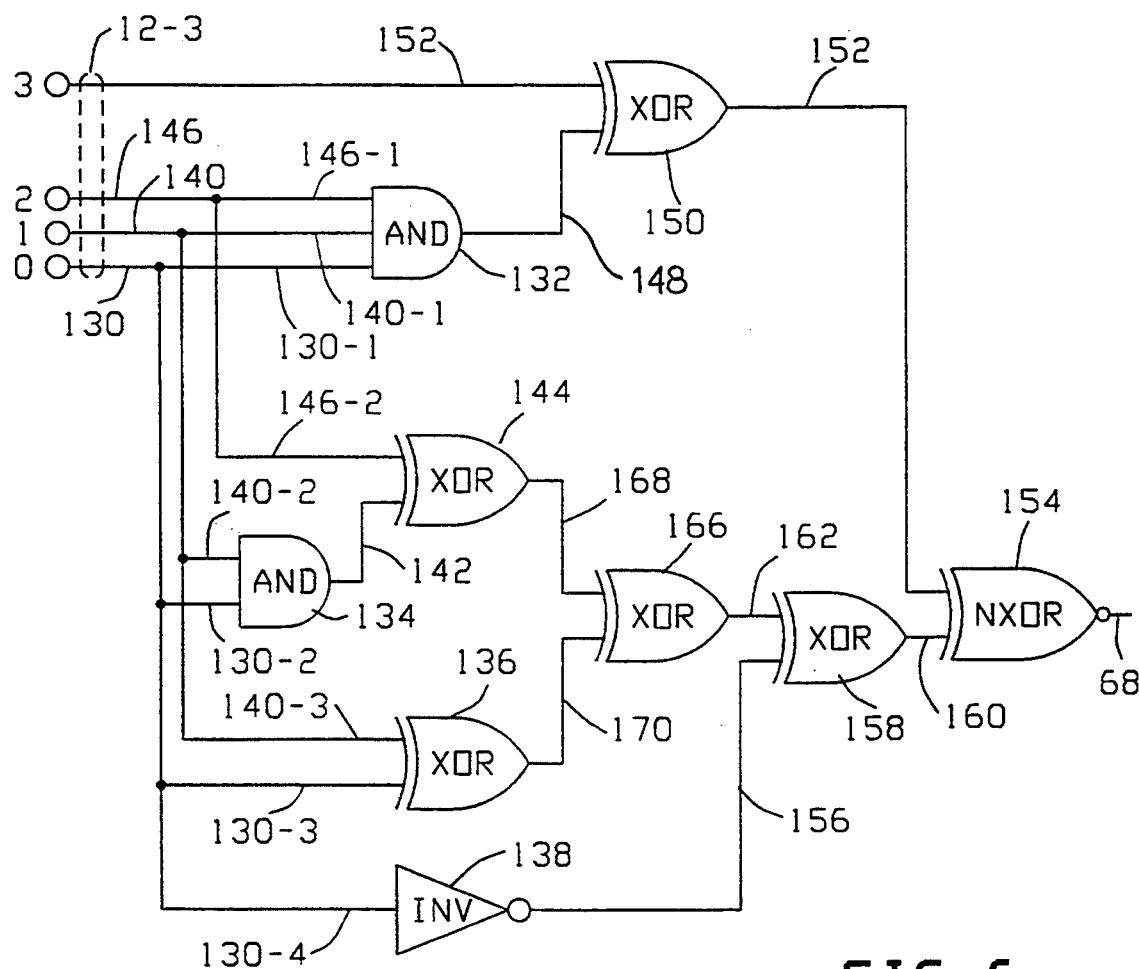
FIG. 6 is a logic diagram illustrating the parity prediction function based upon the count from the associated counter.

FIG. 6 is a logic diagram illustrating the parity prediction function based upon the count from the associated counter. The Parity Prediction circuitry 60 (see FIG. 4) receives the count input signals on conductors in cable 12-3. Count 0 is provided on line 130 and is directed on line 130-1 to AND 132, on line 130-2 to AND 134, on line 130-3 to X OR 136, and on line 130-4 to inverter INV 138. Count 1 is applied on line 140 and is directed on line 140-1 to AND 132, on line 140-2 to AND 134, and on line 140-3 as the second input to X OR 136. The output signal from AND 134 is provided on line 142 to X OR 144. Count 2 is applied on line 146 and is directed line 146-1 to AND 132 and on line 146-2 as the second input to X OR 144. The output signal from AND 132 is applied on line 148 to X OR 150, while Count 3 is applied on line 152 as the second input to X OR 150. The output signal from X OR 150 is provided on line 152 as one of the input signals to NX OR 154. The output signal from INV 138 is provided on line 156 as one input signal to X OR 158, which provides as its output signal, the second input to NX OR 154 on line 160. The second input signal to X OR 158 is received on line 162 from X OR 166 which derives one of its input signals from X OR 144 on line 168 and the other of its input signals on line 170 from X OR 136.

Assuming the same binary example 1011 shown as example 122 in FIG. 3, it can be seen that the Count 0 of 1 will result in a 0 output from INV 138 to X OR 158. The Count 0 value of 1 and the Count 1 value of 1 applied to X OR 136 will result in its providing a 0 as an input to X OR 166. At the same time, the Count 0 of 1 and the Count 1 of 1 to AND 134 will provide a 1 on line 142 to X OR 144. Since Count 0 is 0 for this example, and is applied directly to X OR 144, this combination of binary 1 and binary 0 will result in a binary 1 being provided on line 168 to X OR 166. With binary 0 and binary 1 input signals to X OR 166, a binary 1 will be provided to X OR 158. Recalling that INV 138 provided a 0, X OR 158 will provide a binary 1 to NX OR 154. By applying a Count 0 of 1 and Count of 1 of 1 and a Count 2 of 0 to AND 132, it provides a 0 on line 148 to X OR 1.50. Since Count 3 is 1 and is applied directly to X OR 150, this combination of binary 0 and binary 1 inputs will result in X OR 1.50 providing binary 1 on line 152 to NX OR 154. With NX OR 154 receiving 2 binary 1 input signals it will provide a binary 1 output signal on line 68 as the Predicted Parity, matching the entry in column 42 for the sample binary count applied. Application of the other Count signal combination result in determination of the appropriate Predicted Parity signals.

Returning to a consideration of FIG. 4 in conjunction with the timing configurations of FIG. 2, it can be seen that for a Clock cycle 40-1 that the Predicted Parity will be transferred through MUX-176 at Clock cycle 40-2 to be stored as the Current Parity in FF-1. At that same time, the Counter 10 would be advanced and applied as a input to the Parity Prediction circuitry 60. At the next subsequent Clock cycle 40-3, the output of the FF-1 would pass through MUX-2 to be stored as the Previous Parity in FF-2. At the same time the Counter would again be advanced, the second Predicted Parity would be established in FF-1 and so on.

In operation, it can be seen that for any particular count the Parity Check circuitry 62 evaluates the parity of the count as it is encountered. If correct, it signals OR 66 on line 64 with an appropriate 0 signal. If there is an error, however, in the count as applied, the Current Parity stored in FF-1 will not compare to the appropriate parity and an error signal will be provided on line 64 from the Parity Check circuitry. At the same time AND 70 and NAND 74 will be checking for an appropriate combination of input signals, respectively. As described, if either of the Parity Check circuitry 62, AND 70, or NAND 74 detect an error, OR 66 will provide the error signal on line 20. This operation assures that a malfunction of Counter 10 will be detected during the dock cycle during which the malfunction occurred. This will immediately notify the Control Section 22 and External Circuit 14 of error condition such that appropriate steps can be taken to either halt operation or modify operation to avoid faulty operation or contamination of data.

From the foregoing description of the preferred embodiment, it will be understood by those skilled in the art that the various stated objectives of the invention have been met. Having described the preferred embodiment, various modifications, substitutions, and deletions may well be apparent to those skilled in the art with departing from the spirit and scope of the invention. It is intended, therefore, that the Specification be descriptive of the invention without limiting its scope. Accordingly, what is intended to be protected by Letters Patent is set forth in the appended claims.

What is claimed:

1. For use with a binary counter operating in response to count advance signals to provide binary count signals with a predetermined parity system for use in detecting errors and a source of initializing signals, a counter error detection system comprising;
    input terminals arranged to receive the binary count signals from the binary counter;
    a parity checking circuit coupled to said input terminals and arranged to provide a first parity error signal when the binary count signals do not satisfy the predetermined parity system;
    a parity prediction circuit coupled to said input terminals and arranged to provide a predicted parity signal indicative of the parity for the next sequential count of the binary counter;
    a first bistable device coupled to said parity prediction circuit for temporarily storing said predicted parity signal as the current parity signal during the occurrence of a first next applicable count advance signal;
    a second bistable device coupled to said first bistable device for temporarily storing said current parity signal as the previous parity signal during the occurrence of a second next applicable count advance signal;
    a comparator circuit coupled to said parity checking circuit, to said parity prediction circuit, to said first bistable device and to said second bistable device said comparator circuit operable during the occurrence of each of the count advance signals, and arranged to provide a second parity error signal when said predicted parity signal, said current parity signal, and said previous parity signal fail to have a predetermined relationship;
    whereby it can be determined that the binary counter has failed to properly advance during count advance cycle during which the malfunction occurs.

2. A counter error detection system as in claim 1 wherein said comparator includes:
    a first comparison device to provide a first counter error signal when said predicted parity signal, said current parity signal, and said previous parity signal to exhibit a first predetermined relationship indicative of faulty counter operation;
    a second comparison device to provide a second counter error signal when said predicted parity signal, said current parity signal, and said previous parity signal to exhibit a second on predetermine relationship indicative of fault counter operation; and
    an OR circuit coupled to said parity check circuit, to said first comparison device, and to said second comparison device to provide said second parity error signal in response to the occurrence of any one of said first parity error signal, said first counter error signal, or said second counter error signal.

3. A counter error detection system as in claim 2 wherein said first comparison device verifies whether or not said first predetermined relationship is the occurrence of binary zero's for each said predicted parity signal, said current parity signal, and said previous parity signal.

4. A counter error detection system as in claim 3 wherein said second comparison device verifies whether or not said second predetermined relationship is the occurrence of binary one's for each said predicted parity signal, said current parity signal, and said previous parity signal.

5. A counter error detection system as in claim 1 and further including an initializing circuit coupled to said first bistable device and to said second bistable device, said initializing circuit responsive to the initialize signals to set said first bistable device and said second bistable device to predetermined states indicative of preset current parity and preset previous parity, respectively, for the initialized count of the binary counter.

6. A counter error detection system as in claim 5 wherein said initializing circuit includes a first multiplexer coupled to said parity prediction circuit and to said first bistable device, and a second multiplexer coupled to said first bistable device and to said second bistable device, each said first multiplexer and said second multiplexer including select input circuits for setting said preset current parity and said preset previous parity into said a first bistable device and said second bistable device, respectively, in response to the initializing signals, and for selecting the transfer of the predicted parity signal through said first bistable device and through said second bistable device in the absence of the initializing signals on sequential occurrences of the count advance signals.

7. For use with a binary counter operating in response to count advance signals to provide binary count signals with a predetermined parity system for use in detecting errors and with a source of initializing signals, a counter error detection system comprising:
    input terminals arranged to receive the binary count signals from the binary counter;
    a parity checking circuit coupled to said input terminals and arranged to provide a first parity error signal when the binary count signals do not satisfy the predetermined parity system;

a parity prediction circuit coupled to said to input terminals and arranged to provide a predicted parity signal indicative of the parity for the next sequential count of the binary counter;

a first multiplexer circuit coupled to said parity prediction circuit and arranged to receive the initializing signals;

a first bistable device coupled to said first multiplexer circuit for temporarily storing either a predetermined parity state signal established by the initializing signals or for temporarily storing said predicted parity signal as the current parity signal during the occurrence of a first next applicable count advance signal;

a second multiplexer circuit coupled to said first bistable device and responsive to the initializing signals;

a second bistable device coupled to said second multiplexer circuit for temporarily storing and initialized previous parity in response to the initializing signals or for temporarily storing said current parity signal as the previous parity signal during the occurrence of a second next applicable count advance signal;

a comparator circuit coupled to said parity checking circuit, to said parity prediction circuit, to said first bistable device, and to said second bistable device, said comparator circuit operable during the occurrence of each of the count advance signals, and arranged to provide a second parity error signal when the said predicted parity signal, said current parity signal, and said previous parity signal fail to have a predetermined relationship;

wherein it can be determined that the binary counter has failed to properly advance during the count advance cycle during which the malfunction occurs.

8. A counter error detection system as in claim 7 wherein said comparator circuit includes a first comparison device to provide a first counter error signal when said predicted parity signal, said current parity signal, and said previous parity signal fail to exhibit a first predetermined relationship;

a second comparison device to provide a second counter error signal when said predicted parity signal, said current parity signal, and said previous parity signal fail to exhibit a second predetermined relationship; and an OR circuit coupled to said parity check circuit, to said first comparison device and to said second comparison device to provide said second parity error signal in response to the occurrence of any of said first parity error signal said first counter error signal, or said second counter error signal.

9. A counter error detection system as in claim 8 wherein said first comparison device includes a logical AND tire, it for verifying whether or not said first predetermined relationship is the occurrence of binary one's for each said predicted parity signal, said current parity signal, and said previous 10. A counter error detection system as in claim 9 wherein said second comparison device includes a logical NAND circuit utilized to verify whether or not said second predetermined relationship is the occurrence of binary zero's for each said predicted parity signal, said current parity signal, and said previous parity signal.

11. For use in a data processing system having a source of count advance signals, and a source of selection and initializing signals, an improved counter with error detection comprising;

binary counter means responsive to the count advance signals for providing binary count signals;

parity check means coupled to said binary counter means for checking the parity of the binary count signals and including parity error means for providing a first parity error signal when a parity error is detected;

parity prediction means coupled to said binary counter means for providing parity prediction signals;

first storage means coupled to said parity prediction means for temporarily storing said predicted parity signal as the current parity signal during the occurrence of a first next applicable count advance signal;

second storage means coupled to said first storage means for temporarily storing said current parity signal as the previous parity signal during the occurrence of a second next applicable count advance signal;

multiplexer means coupled to said parity prediction means, said first storage means and said second storage means for initializing said first storage means in response to the initializing signals and for passing said predicted parity signal to said first storage means and said second storage means on successive count advance signals;

comparator means coupled to said parity checking means said parity prediction means, said first storage means and said second storage means for providing a second parity error signal when the said predicted parity signal, said current parity signal, and said previous parity signal fail to have a predetermined relationship during the applicable count advance cycle.

* * * * *